US009461038B2

(12) United States Patent
Harada

(10) Patent No.: US 9,461,038 B2
(45) Date of Patent: Oct. 4, 2016

(54) SEMICONDUCTOR DEVICE WITH RESISTANCE CIRCUIT

(71) Applicant: SEIKO INSTRUMENTS INC., Chiba-shi, Chiba (JP)

(72) Inventor: Hirofumi Harada, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/711,589

(22) Filed: May 13, 2015

(65) Prior Publication Data
US 2015/0243650 A1 Aug. 27, 2015

Related U.S. Application Data

(62) Division of application No. 14/073,167, filed on Nov. 6, 2013, which is a division of application No. 13/417,425, filed on Mar. 12, 2012, now abandoned.

(30) Foreign Application Priority Data

Mar. 13, 2011 (JP) ................................. 2011-054902

(51) Int. Cl.
H01L 21/20 (2006.01)
H01L 27/06 (2006.01)
H01L 23/522 (2006.01)
H01L 49/02 (2006.01)

(52) U.S. Cl.
CPC ....... *H01L 27/0629* (2013.01); *H01L 23/5226* (2013.01); *H01L 28/20* (2013.01); *H01L 28/24* (2013.01); *H01L 2924/0002* (2013.01)

(58) Field of Classification Search
None
See application file for complete search history.

(56) References Cited

U.S. PATENT DOCUMENTS

| 3,776,786 | A | * | 12/1973 | Dunkley | ............ H01L 21/8222 |
| | | | | | 148/DIG. 106 |
| 4,489,104 | A | | 12/1984 | Lee | ................................ 427/101 |
| 5,030,588 | A | * | 7/1991 | Hosaka | ................... H01L 28/24 |
| | | | | | 257/379 |
| 5,656,861 | A | | 8/1997 | Godinho et al. | .............. 257/758 |
| 5,959,343 | A | * | 9/1999 | Harada | ............... H01L 27/0688 |
| | | | | | 257/528 |
| 6,054,359 | A | | 4/2000 | Tsui et al. | ..................... 438/385 |
| 6,504,220 | B2 | | 1/2003 | Sato | .............................. 257/380 |
| 6,921,962 | B1 | * | 7/2005 | Bailey | .............. H01L 21/28044 |
| | | | | | 257/154 |
| 6,943,414 | B2 | | 9/2005 | Kar Roy et al. | ............. 257/379 |
| 7,691,717 | B2 | | 4/2010 | Chinthakindi et al. | ....... 438/382 |
| 2004/0175924 | A1 | | 9/2004 | Choi et al. | .................... 438/622 |
| 2007/0117327 | A1 | * | 5/2007 | Lee | ..................... H01L 27/0629 |
| | | | | | 438/266 |

FOREIGN PATENT DOCUMENTS

JP 09051072 2/1997

* cited by examiner

*Primary Examiner* — Bradley K Smith
(74) *Attorney, Agent, or Firm* — Adams & Wilks

(57) ABSTRACT

A semiconductor device includes an insulated gate field effect transistor and a resistance circuit having a resistance element. The resistance element has a first thin film arranged on an isolation oxide film provided on a surface of a semiconductor substrate, a second thin film of silicon nitride formed on the first thin film so as to be wider than the resistance element, an intermediate insulating film of silicon oxide formed on the second thin film, a contact hole passing through the second thin film and provided in the intermediate insulating film at a depth reaching the first thin film, and a metal wiring formed in the contact hole. The insulated gate field effect transistor is provided in a region of the semiconductor substrate surrounded by the isolation oxide film.

18 Claims, 6 Drawing Sheets

SEMICONDUCTOR DEVICE WITH RESISTANCE CIRCUIT

BACKGROUND OF THE INVENTION

1. Field of the Invention

The present invention relates to a semiconductor device having a semiconductor integrated circuit with a resistance circuit formed on the same semiconductor substrate.

2. Description of the Related Art

In a semiconductor integrated circuit, the following types of resistors are used: a diffused resistor made from a monocrystalline silicon semiconductor substrate into which impurities of a conductivity type opposite to that of the semiconductor substrate are introduced; and a polycrystalline silicon resistor made of polycrystalline silicon into which impurities are introduced.

A sectional view in which a resistance element used for a conventional resistance circuit and an insulated gate field effect transistor (hereinafter, abbreviated to MISFET) are combined is shown in FIG. 2.

A MISFET 102 includes a thin gate oxide film 3, source and drain regions 4, and a gate electrode 5. The MISFET 102 is surrounded by a thick isolation oxide film 2. On those films, an intermediate insulating film 8 is formed, and electrical connection is achieved by metal wiring 10 via contact holes 9.

Further, a resistance element 101 is formed of a polycrystalline silicon film deposited on the flat and thick isolation oxide film 2.

In the polycrystalline silicon film forming the resistance element, there are formed high concentration impurity regions 6 at both ends of the polycrystalline silicon film and a low concentration impurity region 7 sandwiched between the high concentration impurity regions 6. The resistance value of the resistance element is determined depending on a resistivity, which is determined depending on the impurity concentration of the low concentration impurity region 7 having high resistance, and the length and the width of the low concentration impurity region 7. The high concentration impurity regions 6 are used for obtaining ohmic contact with respect to the metal wiring.

The intermediate insulating film 8 is formed on the resistance element 101, and electrical connection is achieved by the metal wiring 10 via the contact holes 9. In the resistance circuit used for the semiconductor integrated circuit, a plurality of the resistance elements of FIG. 2 are formed on the same substrate surface so as to be connected in series or in parallel to one another via the metal wiring.

The intermediate insulating film 8 formed on the MISFET 102 and the resistance element 101 contains boron or phosphorus, and is flattened through thermal treatment of 850° C. or higher. Thus, the difference in height in the semiconductor integrated circuit caused by the film patterns is reduced. Further, after the metal wiring is formed, a silicon nitride passivation film 11 is provided thereon as a protective film.

The contact holes provided in the flattened intermediate insulating film 8 as described above have depths that differ depending on the underlying structures. In the example described above, since parts of the intermediate insulating film provided on the source and the drain in the semiconductor substrate are the thickest, and a part of the intermediate insulating film provided on the resistance element is the thinnest, the contact holes for the source and the drain are the deepest, and the contact holes for the resistance element are the shallowest when the contact holes are formed in the respective parts.

When the contact holes with two depths are formed simultaneously, the contact holes for the resistance element, on which the thin intermediate insulating film is provided, are finished first, and hence until the contact holes for the source and the drain are completely made, excessive over-etching is performed on the contact holes for the resistance element. Accordingly it is necessary to set the thickness of the polycrystalline silicon film to be thick enough to prevent the contact hole from passing through the resistance element during the over-etching, or it is necessary to ensure the resistance to etching.

As a method for solving the above-mentioned problem, for example, such methods illustrated in FIGS. 3 and 4 are proposed.

In FIG. 3, in order to improve the strength to the over-etching, the contact hole 9 for connection with the metal wiring 10 is formed on a thick polycrystalline silicon film 16. Meanwhile, the resistance element main body 7 is formed of a thin polycrystalline silicon film, and the thick polycrystalline silicon film and the thin polycrystalline silicon film are connected to each other through via holes 13 provided separately from the contact hole 9 for connection with the metal wiring 10.

Further, in FIG. 4, the corresponding part to the thick polycrystalline silicon film in FIG. 3 is replaced by an impurity diffusion region 17 formed in the semiconductor substrate. Then, similar to the case of FIG. 3, the resistance element main body is formed of a thin polycrystalline silicon film, and the impurity diffusion regions and the thin polycrystalline silicon are connected to each other through via holes 13 provided separately from the contact holes 9 for connection with the metal wiring.

Such method of providing a polycrystalline silicon resistor is disclosed in, for example, Japanese Published Patent Application H09-051072.

As for manufacturing the conventional resistance element, the following problems arise.

For example, when the polycrystalline silicon resistor is employed, in order to aim for improvement in accuracy of the resistance value or increase in resistance value, the reduction of the thickness of the polycrystalline silicon film is aimed for in some cases. Particularly in recent years, along with advancement of devices and improvement in controllability of the thickness of the film to be deposited, it has become easier to realize a thin film. However, as described above, thin films have a problem of resistance to over-etching, and hence it has been difficult to utilize a resistance element formed of a thin film of 500 Å or smaller in the semiconductor integrated circuit.

In order to realize a resistance element formed of a thin film with a method other than those illustrated in FIGS. 3 and 4, there is a method of forming the resistance element by performing photomasking steps and etching steps separately for respective contacts. However, this method has a problem of causing increase in cost due to addition of the masking step. Further, when the contact holes having one depth are formed after the contact holes having another depth are formed, it is necessary to perform the photolithography process while the contact holes formed earlier are opened, which may cause contamination and adhesion of foreign matters and reduce the quality.

SUMMARY OF THE INVENTION

In order to solve the above-mentioned problems, the present invention employs the following techniques.

That is, a semiconductor device includes a resistance circuit including:
a resistance element formed of a first thin film;
a second thin film formed on the resistance element;
an intermediate insulating film formed on the second thin film;
a contact hole for the resistance element, the contact hole passing through the second thin film and being provided in the intermediate insulating film at a depth reaching the first thin film; and
a metal wiring formed on the contact hole.

Alternatively, in the semiconductor device including the resistance circuit, the second thin film is formed on the first thin film and has the same shape in plan view as the resistance element formed of the first thin film.

Alternatively, in the semiconductor device including the resistance circuit, the second thin film is formed on the first thin film and is formed in separated regions each including the contact hole.

Alternatively, in the semiconductor device including the resistance circuit, the second thin film is formed on the first thin film and is formed in a region including the resistance element formed of the first thin film, the region being wider than the resistance element.

Further, in the semiconductor device including the resistance circuit, the first thin film has a thickness of 500 Å or smaller.

Further, in the semiconductor device including the resistance circuit: the first thin film is a first polycrystalline silicon film; and the first polycrystalline silicon film contains impurities of a first conductivity type at an impurity concentration in a range of $1 \times 10^{15}$ atoms/cm$^3$ to $5 \times 10^{19}$ atoms/cm$^3$.

Alternatively, in the semiconductor device including the resistance circuit, the first thin film is a thin film made of one of CrSi, CrSiN, CrSiO, NiCr, and TiN.

Alternatively, in the semiconductor device including the resistance circuit, the second thin film is a second polycrystalline silicon film containing impurities of a second conductivity type, which is opposite to the first conductivity type of the first polycrystalline silicon film.

Alternatively, in the semiconductor device including the resistance circuit, the second thin film is a second polycrystalline silicon film which does not contain impurities.

Alternatively, in the semiconductor device including the resistance circuit, the second thin film is a silicon nitride film.

Further, in the semiconductor device including the resistance circuit, the second thin film has a thickness in a range of 150 Å to 350 Å.

According to the present invention, it is possible to provide a semiconductor device formed of a semiconductor integrated circuit having a built-in resistance element with high accuracy and high resistance since it becomes easier to form a thin film of 500 Å or smaller for the resistance element.

BRIEF DESCRIPTION OF THE DRAWINGS

In the accompanying drawings.

DETAILED DESCRIPTION OF THE PREFERRED EMBODIMENTS

Hereinafter, embodiments of the present invention are described with reference to the drawings.

Figure 1:
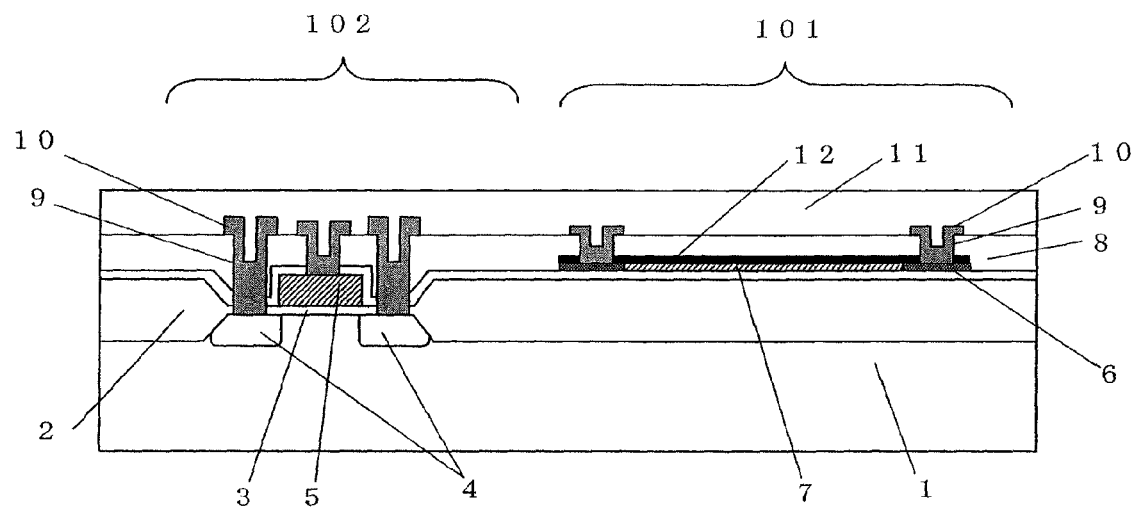
FIG. 1 is a schematic sectional view illustrating a resistance element and a MISFET according to a first embodiment of the present invention.
Figure 2:
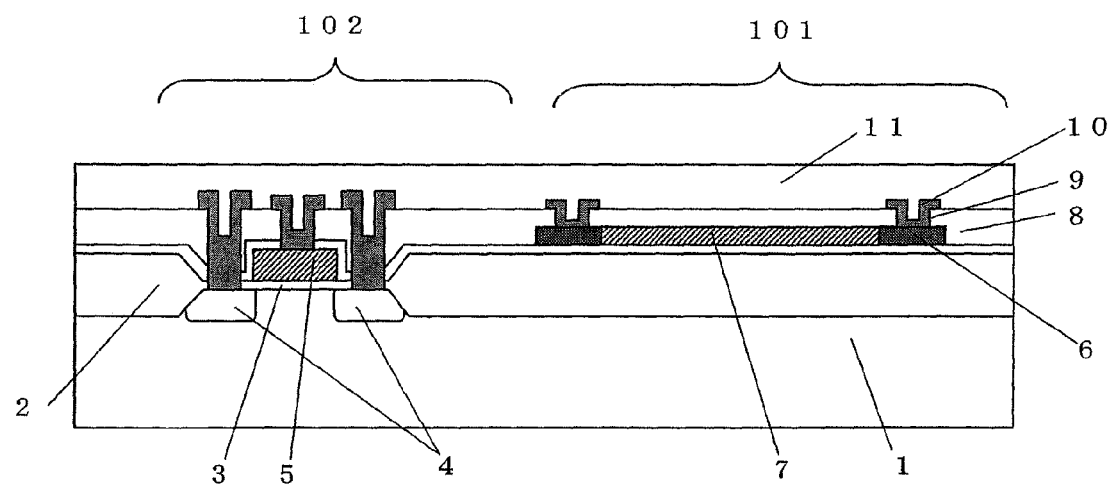
FIG. 2 is a schematic sectional view illustrating a conventional resistance element and a conventional MISFET.
Figure 3:
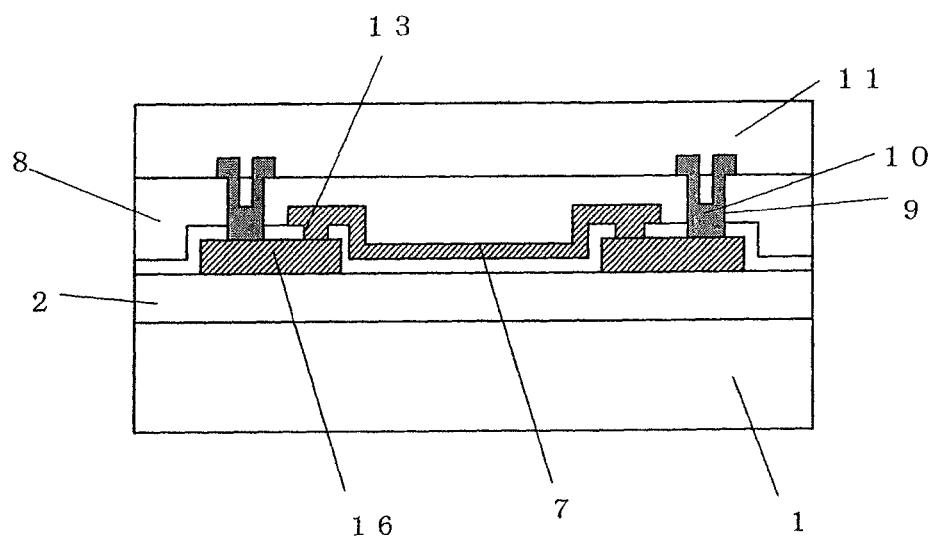
FIG. 3 is a schematic sectional view of a conventional resistance element.
Figure 4:
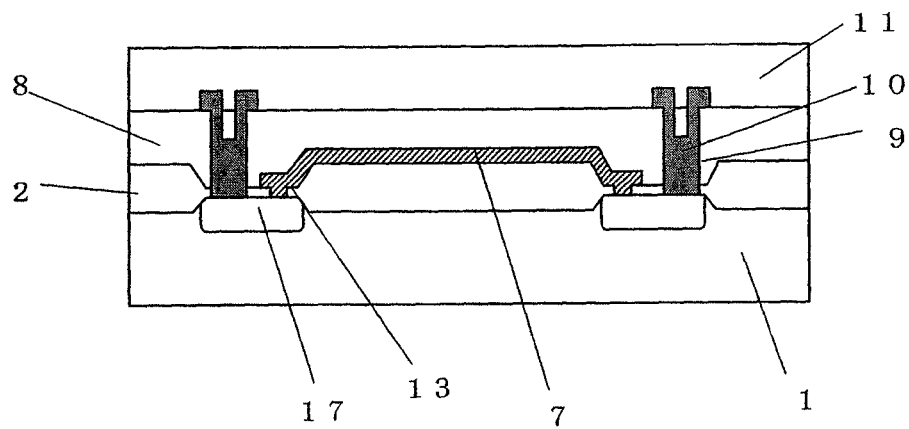
FIG. 4 is a schematic sectional view of a conventional resistance element.

FIG. 1 is a schematic sectional view of a semiconductor integrated circuit having a built-in resistance element according to a first embodiment of the present invention. A resistance element 101 of the present invention for a resistance circuit and a MISFET 102 which is an insulated gate field effect transistor are combined.

Similar to the conventional case, the MISFET 102 includes a thin gate oxide film 3, source and drain regions 4, and a gate electrode 5. The MISFET 102 is surrounded by a thick isolation oxide film 2. On those films, an intermediate insulating film 8 is formed, and electrical connection is achieved by metal wiring 10 via contact holes 9.

Meanwhile, the resistance element 101 is formed of a polycrystalline silicon film deposited on the flat and thick isolation oxide film 2 on a semiconductor substrate 1, and further, an insulator such as a silicon nitride film 12 is deposited thereon.

Similar to the conventional case, in the polycrystalline silicon forming the resistance element, a low concentration impurity region 7 and high concentration impurity regions 6 at both ends of the low concentration impurity region 7 are formed. The resistance value of the resistance element is determined depending on the impurity concentration of the low concentration impurity region 7 having high resistance, and the size of the low concentration impurity region 7. The high concentration impurity regions 6 are used for obtaining ohmic contact with respect to the metal wiring 10. The silicon nitride film 12 formed thereon is an insulating film, and hence the resistance value of the resistance element is basically determined depending on the impurity concentration of the low concentration impurity region.

The intermediate insulating film 8 is formed on the resistance element 101, and electrical connection is achieved by the metal wiring 10 via the contact holes 9. At this time, those contact holes 9 pass through both the intermediate insulating film 8 and the silicon nitride film 12 formed on the resistance element, to thereby reach the high concentration impurity regions 6 of the polycrystalline silicon forming the resistance element. Thus, electrical connection is obtained.

The depths of the contact holes provided in the intermediate insulating film 8, which is flattened through, for example, thermal treatment, differ depending on the underlying structures, and the contact holes for the resistance element are the shallowest. Accordingly, when all of the contact holes are formed in the same masking step, in the conventional case, the contact holes for the resistance element, on which the thin intermediate insulating film is provided, are finished first and hence until all of the contact holes are completely made, excessive over-etching is performed on the contact holes for the resistance element. Consequently, the contact holes pass through the resistance element in some cases when the resistance element is thin.

However, the silicon nitride film provided additionally on the resistance element in the present invention has a low etching rate compared to that of the intermediate insulating film, and hence there is an effect to delay the time that the contact holes pass through the resistance element. Accordingly, even when a thin polycrystalline silicon of 500 Å or smaller is used as the resistance element, the passing through of the contact hole does not occur, and hence it is possible to obtain a good contact.

Referring to FIGS. 5A to 6C, an example of a method of manufacturing the semiconductor integrated circuit according to the present invention is described.

Figure 5A:
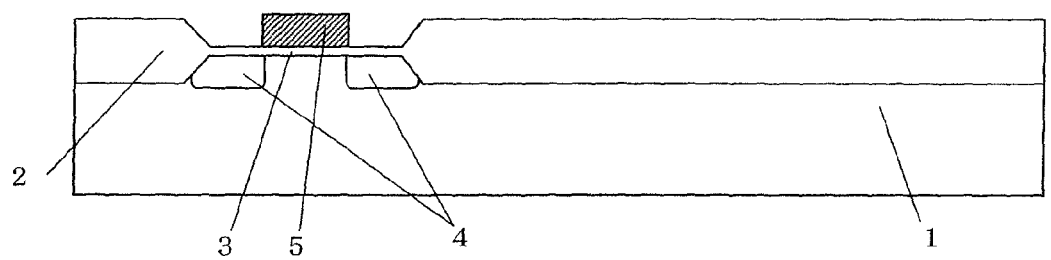
FIGS. 5A to 5C are sectional views illustrating a process flow for manufacturing the resistance element and the MISFET according to the first embodiment of the present invention.

First, as illustrated in FIG. 5A, the semiconductor substrate 1 is prepared, and by conventionally existing technologies such as a LOCOS oxide film forming step, a gate oxide film forming step, a gate electrode forming step, and a source and drain region forming step, there are formed the thick oxide film 2, the gate oxide film 3, the gate electrode 5, and the source and drain regions 4, which are main portions of the MISFET.

Figure 5B:
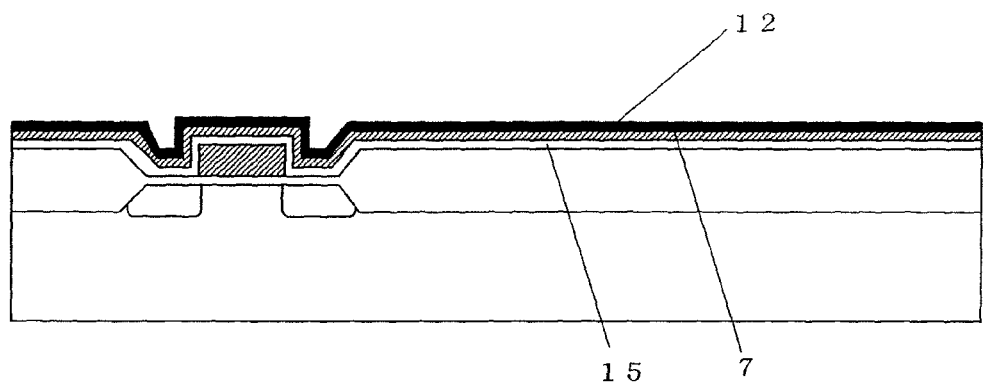

Next, as illustrated in FIG. 5B, a polycrystalline silicon thin film forming the resistance element is deposited after an interlayer insulating film 15 is deposited on the entire surface. The interlayer insulating film is used for separating the polycrystalline silicon forming the gate electrode of the MISFET and the polycrystalline silicon forming the resistance element. The polycrystalline silicon thin film forming the resistance element is formed to have a thickness of 500 Å or smaller so as to achieve high resistance or high accuracy.

Next, impurity implantation for setting the resistivity is performed in the entire polycrystalline silicon film on the semiconductor substrate, to thereby form the polycrystalline silicon low concentration impurity region 7. The resistivity of the resistance element is adjusted by an amount of this impurity implantation. The impurities to be used are phosphorus or arsenic, which is an N-type impurity, or boron or $BF_2$, which is a P-type impurity, and the impurity implantation amount thereof is set, although depending on the desired resistivity, within a range of $1 \times 10^{15}$ atoms/cm$^3$ to $5 \times 10^{19}$ atoms/cm$^3$.

Next, the silicon nitride film 12, which is specific to the present invention, is deposited on the entire semiconductor substrate by an arbitrary method such as LPCVD and sputtering.

Figure 5C:
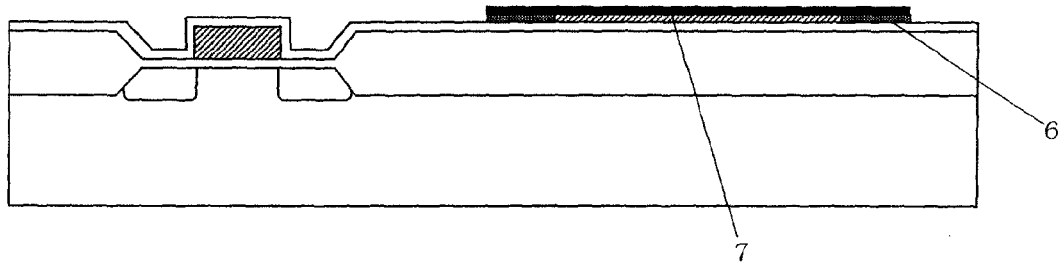

Next, as illustrated in FIG. 5C, through a photomasking step and an etching step, the deposited polycrystalline silicon film and silicon nitride film 12 are processed to the shape of the resistance element. At this time, both of the polycrystalline silicon film and the silicon nitride film are etched with use of the same resist, and the photomasking step is not added. Though the step of depositing the silicon nitride film, which is specific to the present invention, is added, there is minimal cost increase. Then, through another photomasking step, the high concentration impurity regions 6 are formed in the polycrystalline silicon.

The high concentration impurity implantation step can be carried out as a high concentration impurity implantation step for forming the source and the drain of the MISFET. That is, when the resistance element is an N-type resistance element, N-type source and drain impurities may be used as the high concentration impurities, and when the resistance element is a P-type resistance element, P-type source and drain impurities may be used as the high concentration impurities. In so doing it is possible to further reduce a photomasking step and obtain a cost reduction effect.

Figure 6A:
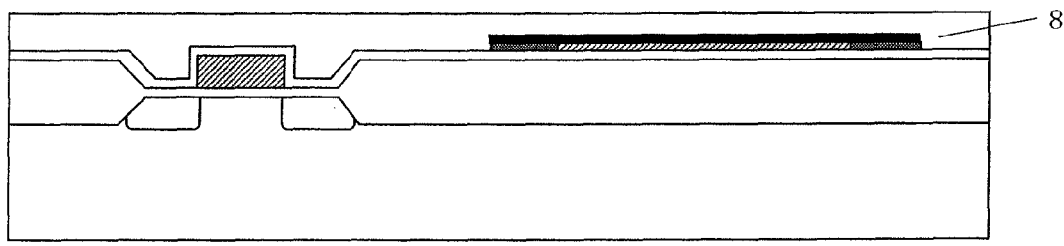
FIGS. 6A to 6C are sectional views illustrating the process flow for manufacturing the resistance element and the MISFET according to the first embodiment of the present invention, which follows the process flow illustrated in FIGS. 5A to 5C.

Next, as illustrated in FIG. 6A, the intermediate insulating film 8 is formed on the semiconductor substrate. The formation method therefor is as follows. After an oxide film containing phosphorus or boron is deposited, the deposited insulating film is flattened by, for example, a reflow method in which flattening is performed through thermal treatment of 850° C. or higher, or by an etch-back method or by a CMP method.

Figure 6B:
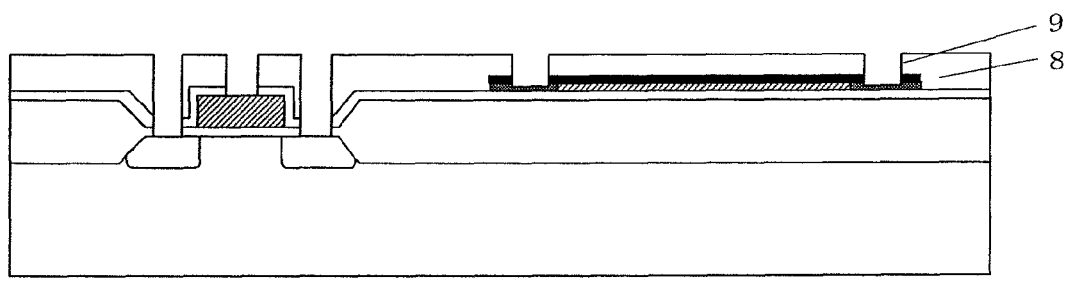

Next, as illustrated in FIG. 6B, through a photomasking step, the contact holes 9 are formed all at once by dry etching at necessary portions of the intermediate insulating film corresponding to, for example, the source and drain regions, the gate electrode, and the resistance element. At this time, the contact holes 9 for the resistance element pass through the silicon nitride film on the polycrystalline silicon film to reach the polycrystalline silicon film. However, the silicon nitride film has an appropriate thickness, and hence even when the polycrystalline silicon film is thin, passing through of the contact hole does not occur.

Figure 6C:
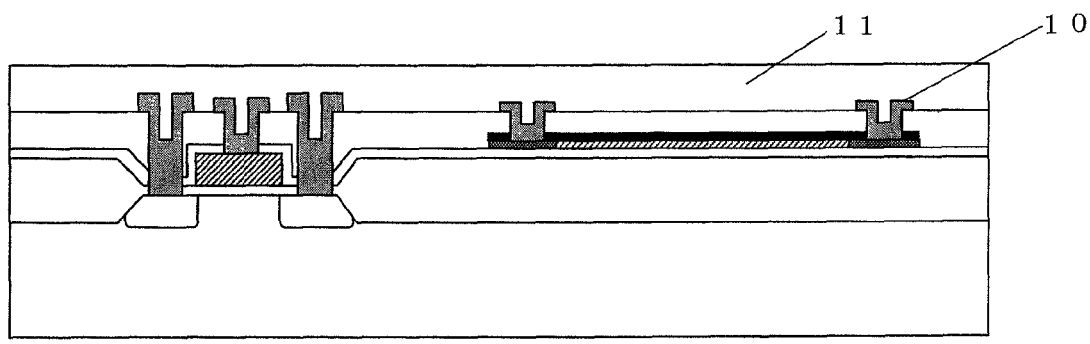

Next, as illustrated in FIG. 6C, deposition of a metal film, pattern formation of the metal wiring 10, and deposition and pattern formation of a passivation film 11, which is the final protective film, are performed. With this, the semiconductor integrated circuit including the resistance element according to this embodiment is completed.

Among the steps, in the contact hole forming step illustrated in FIG. 6B, depending on the shape and structure under the intermediate insulating film, the depths of the contact holes partially differ from one another. For example, the deepest portion is the contact hole for the source and drain regions, and the shallowest portion is the contact hole for the resistance element. The difference therebetween may expand from 3,000 Å to 7,000 Å in some cases. In the conventional manufacturing method, after the contact holes for the resistance element are opened, excessive over-etching is performed in the contact holes for the resistance element by an amount corresponding to at least 3,000 Å to 7,000 Å of the intermediate insulating film until other contact holes are completely opened. Accordingly, when the polycrystalline silicon film of 500 Å or smaller is used as the resistance element, it has been difficult to prevent the passing through of the contact hole.

In the present invention, the thickness of the silicon nitride film on the polycrystalline silicon film described above is appropriately adjusted, and hence the above-mentioned passing through can be prevented. The film thickness is inevitably determined depending on, for example, the film thickness difference of the intermediate insulating film described above, the etching condition, and the quality of the silicon nitride film.

For example, when the selection ratio of the intermediate insulating film and the silicon nitride film during the contact etching is 20:1, and when the intermediate insulating film thickness difference between at the resistance element and at the source and drain regions is 5,000 Å, the thickness of the silicon nitride film provided on the polycrystalline silicon forming the resistance element may be set to 250 Å, which is 1/20 of 5,000 Å corresponding to the intermediate insulating film thickness difference. Generally, considering a case where the intermediate insulating film thickness difference in the above-mentioned range is generated, it is reasonable to select the silicon nitride film thickness from the range of 150 Å to 350 Å. In this manner, it is possible to stably manufacture a resistance element formed of polycrystalline silicon of 500 Å or smaller, which has been difficult to realize in a conventional case.

It is noted that when the thickness of the polycrystalline silicon film to be used for the resistance element is reduced, it is possible to realize high resistance and high accuracy of the resistance value. The reasons are as follows.

It is understood that, when the impurity concentration in the polycrystalline silicon film forming the resistance element is the same, as the polycrystalline silicon film becomes, thinner, the sectional area of the resistor decreases, and hence the resistance increases.

Meanwhile, when the resistance value is the same, as the polycrystalline silicon film becomes thinner, the impurity concentration is set higher, and hence the resistance value fluctuation reduces, which realizes high accuracy. This is because most part of the resistance value formed by the polycrystalline silicon depends on carriers to be captured at in the interface state existing between the grains of the polycrystalline silicon, and hence the rate that the carrier concentration fluctuation affects the resistance value fluctuation is high. The carrier concentration fluctuation is determined depending on the implantation impurity concentration, and when the impurity concentration is high, the fluctuation is alleviated. Accordingly, the reduction in thickness of the polycrystalline silicon film is effective for improving accuracy of the resistance value of the resistance element.

Figure 7:
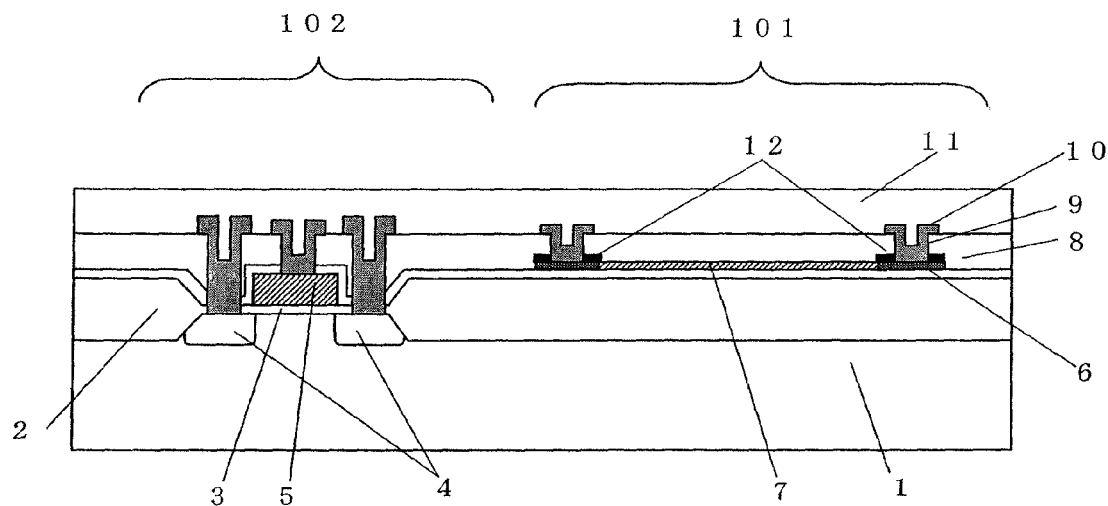
FIG. 7 is a schematic sectional view illustrating a resistance element and a MISFET according to a second embodiment of the present invention.

FIG. 7 is a schematic sectional view of a semiconductor integrated circuit having a built-in resistance element according to a second embodiment of the present invention. In this example, the silicon nitride film 12 is formed on the high concentration impurity regions 6 of the resistance element, but the silicon nitride film is not formed on the low concentration impurity region 7 of the resistance element. In order to realize this structure, the pattern formation of the resistance element and the pattern formation of the silicon nitride film 12 are separately performed, and compared to the structure of FIG. 1, it is necessary to add one photomasking step. Since the patterning accuracy of the silicon nitride film, however, does not affect the pattern formation of the resistance element, and hence it is possible to improve the accuracy of the resistor width at the time of etching of the resistance element, and is possible to obtain a resistance element having a high-accuracy resistance value. Further, there is an effect of reducing a parasitic capacitance between the resistance element and the upper metal wiring.

Figure 8:
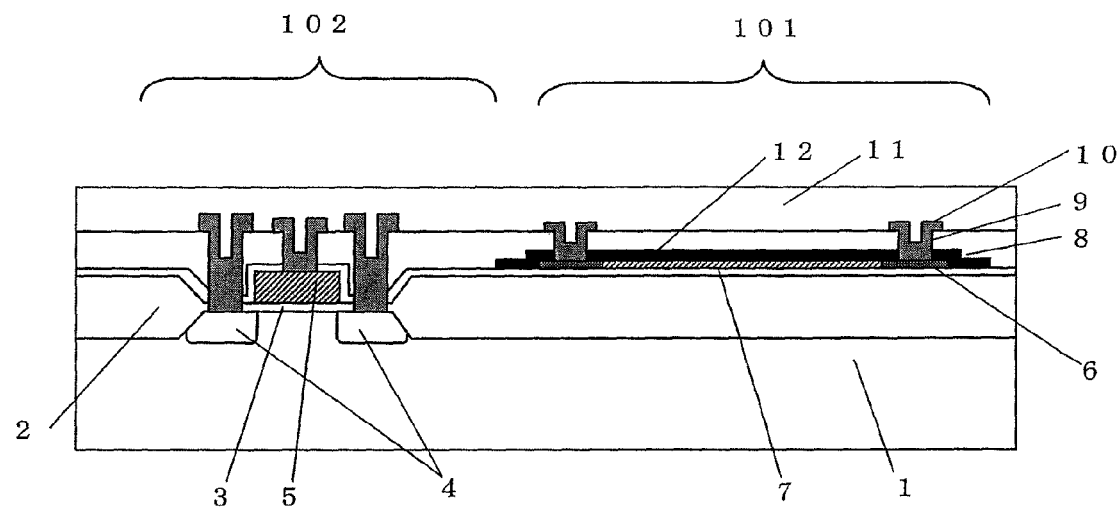
FIG. 8 is a schematic sectional view illustrating a resistance element and a MISFET according to a third embodiment of the present invention.

FIG. 8 is a schematic sectional view of a semiconductor integrated circuit having a built-in resistance element according to a third embodiment of the present invention. In this example, the silicon nitride film 12 to be formed on the resistance element is formed wide so as to sufficiently overlap the resistance element. Similar to the second embodiment, the pattern formation of the resistance element and the pattern formation of the silicon nitride film are separately performed. In this manner, similar to the second embodiment, the pattern formation of the resistance element can be performed without being affected by the patterning accuracy of the silicon nitride film, and hence it is possible to improve the accuracy of the resistor width at the time of etching of the resistance element, and is possible to obtain a resistance element having a high-accuracy resistance value.

Figure 9:
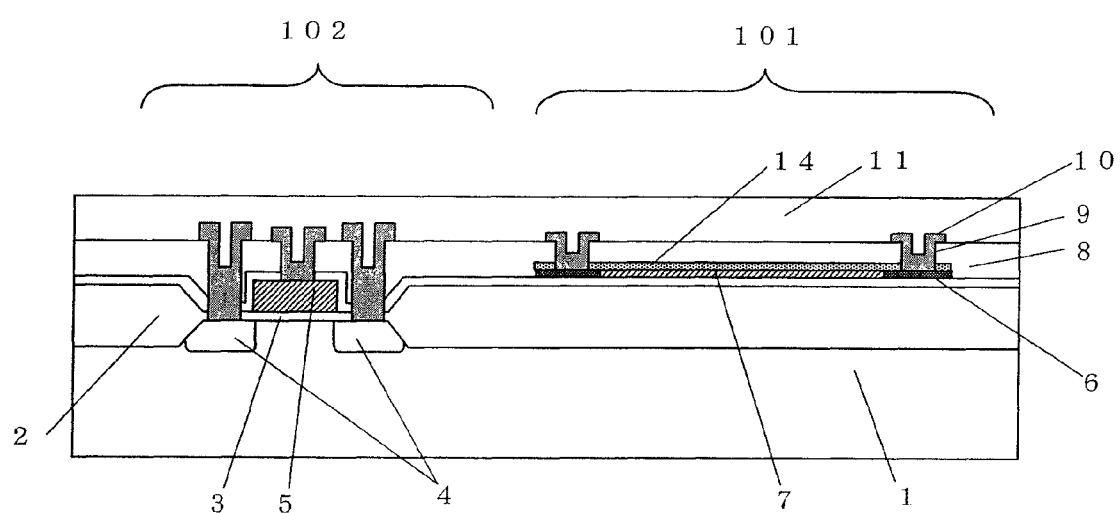
FIG. 9 is a schematic sectional view illustrating a resistance element and a MISFET according to a fourth embodiment of the present invention.

FIG. 9 is a schematic sectional view of a semiconductor integrated circuit having a built-in resistance element according to a fourth embodiment of the present invention. In this example, the film formed on the resistance element, which is the silicon nitride film in FIG. 1, is replaced by a polycrystalline silicon film 14 which does not contain impurities. Impurities are not implanted into this polycrystalline silicon film, and hence the polycrystalline silicon film has very high resistivity. Even when the polycrystalline silicon film is laminated, the resistance value of the underlying resistance element does not vary. Further, at the time of pattern formation of the resistance element, the polycrystalline silicon film of the resistance element and the another polycrystalline silicon film provided thereon can be etched at the same time under the same etching condition, and hence compared to the case of the first embodiment, the number of steps of the etching processing can be reduced. Thus, it is possible to obtain a resistance element effective for cost reduction owing to the reduction in the number of steps, the resistance element having a high-accuracy resistance value and being high in process accuracy of the resistor width.

Further, as a fifth embodiment, the film formed on the resistance element, which is the polycrystalline silicon film which does not contain impurities in the fourth embodiment, can be replaced by a polycrystalline silicon film containing impurities of a conductivity type opposite to that of the resistance element. Since the polycrystalline silicon film forming the resistance element and another polycrystalline silicon film covering the polycrystalline silicon film forming the resistance element contain impurities of conductivity types opposite to each other, an electric insulating property is maintained, and the resistance value of the underlying resistance element does not vary due to the covering of the another polycrystalline silicon film provided on the resistance element.

Still further, the film to be formed on the resistance element is not limited to the silicon nitride film or the polycrystalline silicon film as long as the etching selection ratio with respect to the intermediate insulating film is high and the insulating property with respect to the underlying resistance element is sufficiently maintained. That is, various metal oxides, metal nitrides, and carbon compounds may be selected as the film to be formed on the resistance element.

Further, the film forming the resistance element of the present invention is not limited to the polycrystalline silicon film. It is needless to say that this film is also applicable to a resistor thin film such as a metal thin film made of, for example, CrSi, CrSiN, CrSiO, NiCr, or TiN having a very small thickness of about 500 Å or smaller, through which a contact hole may otherwise pass at the time of the etching processing when the resistor thin film is simply replaced by a polycrystalline silicon film.

What is claimed is:

1. A semiconductor device, comprising:
a resistance circuit comprising a resistance element comprised of a first thin film arranged on an isolation oxide film provided on a surface of a semiconductor substrate, the first thin film being arranged on the isolation oxide film via an interlayer insulating film, a second thin film comprised of silicon nitride formed on the first thin film so as to be wider than the resistance element, the second thin film overlapping the resistance element so as to be disposed in contact with the interlayer insulating film, an intermediate insulating film of silicon oxide formed on the second thin film, a contact hole passing through the second thin film and being provided in the intermediate insulating film at a depth reaching the first thin film, and a metal wiring formed in the contact hole; and an insulated gate field effect transistor provided in a region of the semiconductor substrate surrounded by the isolation oxide film.

2. A semiconductor device according to claim 1; wherein the first thin film has a thickness of 500 Å or smaller.

3. A semiconductor device according to claim 1; wherein the first thin film comprises a first polycrystalline silicon film containing impurities of a first conductivity type at an impurity concentration in a range of $1 \times 10^{15}$ atoms/cm$^3$ to $5 \times 10^{19}$ atoms/cm$^3$.

4. A semiconductor device according to claim 1; wherein the first thin film comprises a thin film made of one of CrSi, CrSiN, CrSiO, NiCr, and TiN.

5. A semiconductor device according to claim 1; wherein the second thin film has a thickness in the range of 150 Å to 350 Å.

6. A semiconductor device according to claim 5; wherein the first thin film has a thickness of 500 Å or smaller.

7. A semiconductor device according to claim 1; wherein the first thin film is comprised of polycrystalline silicon.

8. A semiconductor device, comprising:
a semiconductor substrate
an isolation oxide film provided on a surface of the semiconductor substrate;
an insulated gate field effect transistor provided in a region of the semiconductor substrate surrounded by the isolation oxide film; and
a resistance circuit comprising:
  a polycrystalline silicon film provided on the isolation oxide film via an interlayer insulating film;
  a silicon nitride film formed on the polycrystalline silicon film so as to be wider than and completely overlap the polycrystalline silicon film, the silicon nitride film overlapping the polycrystalline silicon film so as to be disposed in contact with the interlayer insulating film;
  a silicon oxide film formed on the silicon nitride film;
  a contact hole provided in the silicon oxide film and extending through the silicon nitride film so as to reach the polycrystalline silicon film; and
  a metal wiring formed in the contact hole and disposed in contact with the polycrystalline silicon film.

9. A semiconductor device according to claim 8; wherein the polycrystalline silicon film has a thickness of 500 Å or smaller.

10. A semiconductor device according to claim 8; wherein the polycrystalline silicon film contains impurities of a first conductivity type at an impurity concentration in a range of $1 \times 10^{15}$ atoms/cm$^3$ to $5 \times 10^{19}$ atoms/cm$^3$.

11. A semiconductor device according to claim 8; wherein the silicon nitride film has a thickness in the range of 150 Å to 350 Å.

12. A semiconductor device according to claim 11; wherein the polycrystalline silicon film has a thickness of 500 Å or smaller.

13. A semiconductor device according to claim 8; further comprising another contact hole provided in the silicon oxide film and extending through the silicon nitride film so as to reach the polycrystalline silicon film, and another metal wiring formed in the another contact hole and disposed in contact with the polycrystalline silicon film.

14. A semiconductor device, comprising:
a semiconductor substrate;
an isolation oxide film provided on a surface of the semiconductor substrate;
an insulated gate field effect transistor provided in a region of the semiconductor substrate surrounded by the isolation oxide film; and
a resistance circuit comprising:
  a polycrystalline silicon film provided on the isolation oxide film via an interlayer insulating film, the polycrystalline silicon film having a pair of high concentration impurity regions and a low concentration impurity region between the pair of high concentration impurity regions;
  a silicon nitride film formed on the polycrystalline silicon film so as to overlap and completely cover the pair of high concentration impurity regions and the low concentration impurity region, the silicon nitride film overlapping the polycrystalline silicon film so as to be disposed in contact with the interlayer insulating film;
  a silicon oxide film formed on the silicon nitride film;
  a pair of contact holes provided in the silicon oxide film and extending through the silicon nitride film so as to reach the respective pair of high concentration impurity regions of the polycrystalline silicon film; and
  a metal wiring formed in each of the contact holes.

15. A semiconductor device according to claim 14; wherein the polycrystalline silicon film has a thickness of 500 Å or smaller.

16. A semiconductor device according to claim 14; wherein the polycrystalline silicon film contains impurities of a first conductivity type at an impurity concentration in a range of $1 \times 10^{15}$ atoms/cm$^3$ to $5 \times 10^{19}$ atoms/cm$^3$.

17. A semiconductor device according to claim 16; wherein the polycrystalline silicon film has a thickness of 500 Å or smaller.

18. A semiconductor device according to claim 14; wherein the silicon nitride film has a thickness in the range of 150 Å to 350 Å.

* * * * *